US008664731B2

(12) United States Patent  
Blackmer et al.

(10) Patent No.: US 8,664,731 B2  
(45) Date of Patent: Mar. 4, 2014

(54) STRENGTHENED MICRO-ELECTROMECHANICAL SYSTEM DEVICES AND METHODS OF MAKING THEREOF

(75) Inventors: Charles W. Blackmer, Ithaca, NY (US); Scott G. Adams, Ithaca, NY (US); Andrew S. Hocking, Ithaca, NY (US); Kristin J. Lynch, Ithaca, NY (US); Ashish A. Shah, Ithaca, NY (US)

(73) Assignee: Kionix, Inc., Ithaca, NY (US)

( * ) Notice: Subject to any disclaimer, the term of this patent is extended or adjusted under 35 U.S.C. 154(b) by 222 days.

(21) Appl. No.: 13/027,199

(22) Filed: Feb. 14, 2011

(65) Prior Publication Data

US 2012/0205752 A1  Aug. 16, 2012

(51) Int. Cl.  
*H01L 29/84* (2006.01)

(52) U.S. Cl.  
USPC .................. 257/415; 257/E29.323; 716/110

(58) Field of Classification Search  
None  
See application file for complete search history.

(56) References Cited

U.S. PATENT DOCUMENTS

| | | | |
|---|---|---|---|
| 5,563,343 A | 10/1996 | Shaw et al. | |
| 5,610,335 A | 3/1997 | Shaw et al. | |
| 6,009,757 A | 1/2000 | LeComte et al. | |
| 6,051,866 A | 4/2000 | Shaw et al. | |
| 6,239,473 B1 | 5/2001 | Adams et al. | |
| 6,291,875 B1 * | 9/2001 | Clark et al. | 257/622 |
| 6,318,174 B1 | 11/2001 | Schmiesing et al. | |
| 6,342,430 B1 | 1/2002 | Adams et al. | |
| 6,484,578 B2 | 11/2002 | Woodruff et al. | |
| 6,701,786 B2 | 3/2004 | Hulsing, II | |
| 6,792,804 B2 | 9/2004 | Adams et al. | |
| 6,879,016 B1 * | 4/2005 | Skidmore et al. | 257/499 |
| 7,004,028 B2 | 2/2006 | Park et al. | |
| 7,430,909 B2 | 10/2008 | Adams et al. | |
| 7,728,339 B1 | 6/2010 | Adams et al. | |
| 2004/0077178 A1 * | 4/2004 | Yang et al. | 438/710 |
| 2005/0217374 A1 | 10/2005 | Chen et al. | |

FOREIGN PATENT DOCUMENTS

WO    WO 2012/067850 A1    5/2012

OTHER PUBLICATIONS

Jing, Q., et al., "Schematic-Based Lumped Parameterized Behavioral Modeling for Suspended MEMS," *IEE/ACM Digest of Technical Papers* (2002), 7 pages.

International Search Report and Written Opinion for Int'l Appl. No. PCT/US2012/024886, European Patent Office, mailed Aug. 23, 2012, 13 pages.

* cited by examiner

*Primary Examiner* — Wensing Kuo  
(74) *Attorney, Agent, or Firm* — Sterne, Kessler, Goldstein & Fox P.L.L.C.

(57) ABSTRACT

In an embodiment, a micro-electromechanical device can include a substrate, a beam, and an isolation joint. The beam can be suspended relative to a surface of the substrate. The isolation joint can be between a first portion and a second portion of the beam, and can have a non-linear shape. In another embodiment, a micro-electromechanical device can include a substrate, a beam, and an isolation joint. The beam can be suspended relative to a surface of the substrate. The isolation joint can be between a first portion and a second portion of the beam. The isolation joint can have a first portion, a second portion, and a bridge portion between the first portion and the second portion. The first and second portions of the isolation joint can each have a seam and a void, while the bridge portion can be solid.

14 Claims, 9 Drawing Sheets

US 8,664,731 B2

STRENGTHENED MICRO-ELECTROMECHANICAL SYSTEM DEVICES AND METHODS OF MAKING THEREOF

BACKGROUND OF THE INVENTION

1. Field of the Invention

The present invention is directed generally to micro-electromechanical systems and devices (MEMS devices), and more particularly to MEMS devices having an integral electrical isolation structure.

2. Background Art

MEMS devices are electrical and mechanical devices that are fabricated at substantially microscopic dimensions utilizing techniques well known in the manufacture of integrated circuits. Present commercial applications of MEMS technology are predominantly in pressure and inertial sensing, for example, accelerometers and gyroscopes used in hand-held devices, for example, wireless telephones. One common implementation of a MEMS device used to detect acceleration is a capacitive sensor that utilizes an array of cantilever beams, for example, MEMS devices fabricated as described in U.S. Pat. Nos. 6,342,430 and 6,239,473, both of which are incorporated by reference herein.

FIG. 1 schematically illustrates a beam 200 fabricated according to the methods described in U.S. Pat. Nos. 6,342,430 and 6,239,473. The beam 200 has an isolation joint 300 between a distal portion 220 of and a proximal portion 240 of the beam. The terms distal and proximal indicate position relative to a connection with a substrate (not shown) from which the beam is suspended. The isolation joint 300 breaks the electrical connection between the distal portion 220 and the proximal portion 240 of the beam 200. The proximal portion 240 of the beam can be directly or indirectly connected to a substrate (not shown). For example, beam 200 can be cantilevered over a surface of the substrate, which allows the beam 200 to move or flex. When viewed from above, the isolation joint 300 is linear.

FIG. 2 is a cross-sectional view of the isolation joint 300 of FIG. 1 taken along line 2-2. The isolation joint 300 can be formed by etching a linear trench in a substrate, for example, a silicon wafer, and subsequently oxidizing the substrate to create an oxide, for example, silicon dioxide. The oxidation process consumes the silicon sidewalls of the trench to form silicon dioxide, and the sidewalls encroach upon each other as they are converted to silicon dioxide. Typically, the sidewalls contact each other at seam 320 an interface that is not chemically bonded. The side profile of the trench can be reentrant or wider at the bottom than at the top. During the manufacturing process, a reentrant profile can help prevent the formation of silicon stringers that run between the distal portion 220 and the proximal portion 240 of the beam 200, which would prevent effective electrical isolation. Because a reentrant profile is narrower at the top than at the bottom, the top of the isolation trench closes at seam 320 before the bottom of the isolation trench is completely oxidized. Closing the top can cause a void 340 to be formed in a lower half of the isolation joint 300.

MEMS devices having a beam microstructure as described above operate in varied environmental conditions. For example, MEMS devices can be subject to temperature variations, humidity exposure, and mechanical shocks. In addition to being electrically isolated between the beam and the substrate, each beam must have adequate mechanical strength to not fail when subjected to a mechanical shock to function properly. However, the seam 320 and void 340 compromises the mechanical properties of the isolation joint 300 and the beam 200 as a whole. The seam 320 and void 340 allows the entire beam to flex or hinge when a force is applied to the beam 200. A force created by a shock event can cause the beam 200 to deflect, and the resulting strain can lead to a fracture of the beam 200 and failure of the MEMS device.

Accordingly, there is need for improved MEMS devices that can better withstand mechanical shocks.

BRIEF SUMMARY OF THE INVENTION

An embodiment of the present invention provides improved MEMS devices that can better withstand mechanical shocks.

In an embodiment, a micro-electromechanical device can include a substrate, a beam, and an isolation joint. The beam can be suspended relative to a surface of the substrate. The isolation joint can be between a first portion and a second portion of the beam, and can have a non-linear shape.

In one embodiment, a method of making a micro-electromechanical device having a non-linear isolation joint can include forming a non-linear isolation trench in a substrate, filling the isolation trench with a dielectric material, and forming a beam that is suspended relative to a surface of the substrate.

In another embodiment, a micro-electromechanical device can include a substrate, a beam, and an isolation joint. The beam can be suspended relative to a surface of the substrate. The isolation joint can be between a first portion and a second portion of the beam. The isolation joint can have a first portion, a second portion, and a bridge portion between the first portion and the second portion. The first and second portions of the isolation joint can each have a seam and a void, while the bridge portion can be solid.

In one embodiment, a method of making a micro-electromechanical device having an isolation joint with a bridge portion can include forming a first isolation trench and a second isolation trench in a substrate, and filling the first isolation trench and the second isolation trench with a dielectric material by thermally oxidizing the substrate. The portion of the substrate that is between the first isolation trench and the second isolation trench is an oxide after thermal oxidation. The method can further include forming a beam that is suspended relative to a surface of the substrate.

In an embodiment, a computer-program product can include a computer-readable storage medium that contains instructions that, if executed on a computing device, define a micro-electromechanical device having a substrate, a beam suspended relative to a surface of the substrate, and an isolation joint between a first portion and second portion of the beam. The isolation joint can have a non-linear shape.

In another embodiment, a computer-program product can include a computer-readable storage medium containing instructions that, if executed on a computing device, define a micro-electromechanical device having a substrate, a beam suspended relative to a surface of the substrate, and an isolation joint between a first portion and a second portion of the beam. The isolation joint can include a first portion, a second portion, and a bridge portion between the isolation joint's first portion and second portion. The bridge portion can be solid.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

Figure 1:
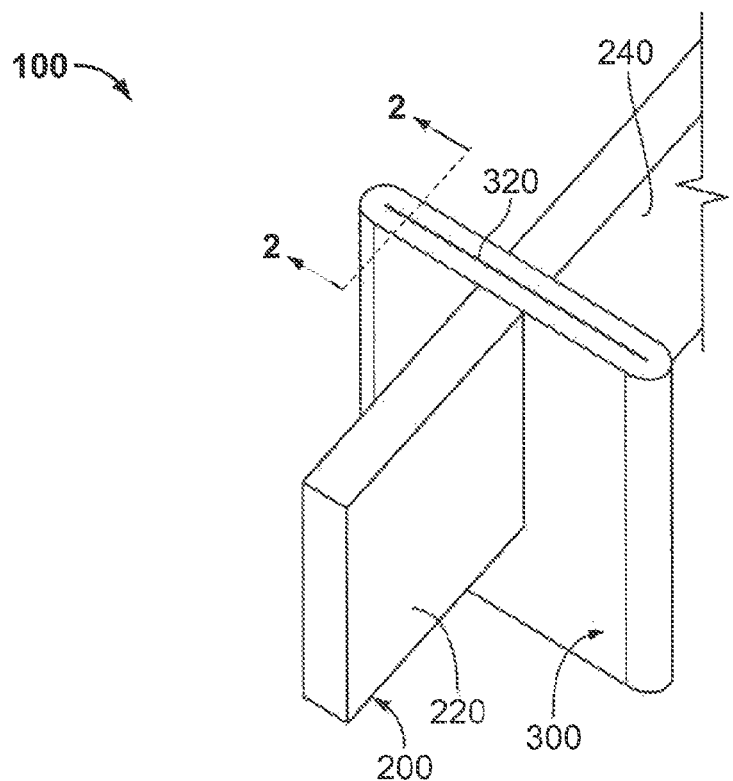
FIG. 1 is a perspective view of a beam of a MEMS device having an isolation joint that fabricated according to a known isolation process.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements.

DETAILED DESCRIPTION OF THE INVENTION

It is noted that references in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

As mentioned above, the present invention is directed to MEMS devices having isolation joints with improved mechanical properties to better withstand mechanical shocks. First, MEMS devices having non-linear isolation joints and methods of making such MEMS devices according to embodiments of the present invention are described. Second, MEMS devices having isolation joints with bridge portions and methods of making such MEMS devices according to embodiments of the present invention are described. Third, software implementations of MEMS devices having non-linear isolation joints and bridge portions and methods of making such MEMS devices are explained.

MEMS Devices Having Non-Linear Isolation Joints

In an embodiment, a micro-electromechanical device can include a substrate, a beam, and an isolation joint that has a non-linear shape. Referring collectively to FIGS. 3-6, the beam 200 is suspended above a surface of a substrate (not shown). The beam 200 can have a distal portion 220 and proximal portion 240. The proximal portion 240 can be connected to the substrate so as to support the beam 200, for example, in a cantilever fashion. The beam 200 and the substrate can be made of, for example, silicon or other suitable materials. The non-linear isolation joint can improve the mechanical properties of the beam 200 by increasing the beam's stiffness. Improving the beam's stiffness helps prevent the beam from fracturing.

Figure 3:
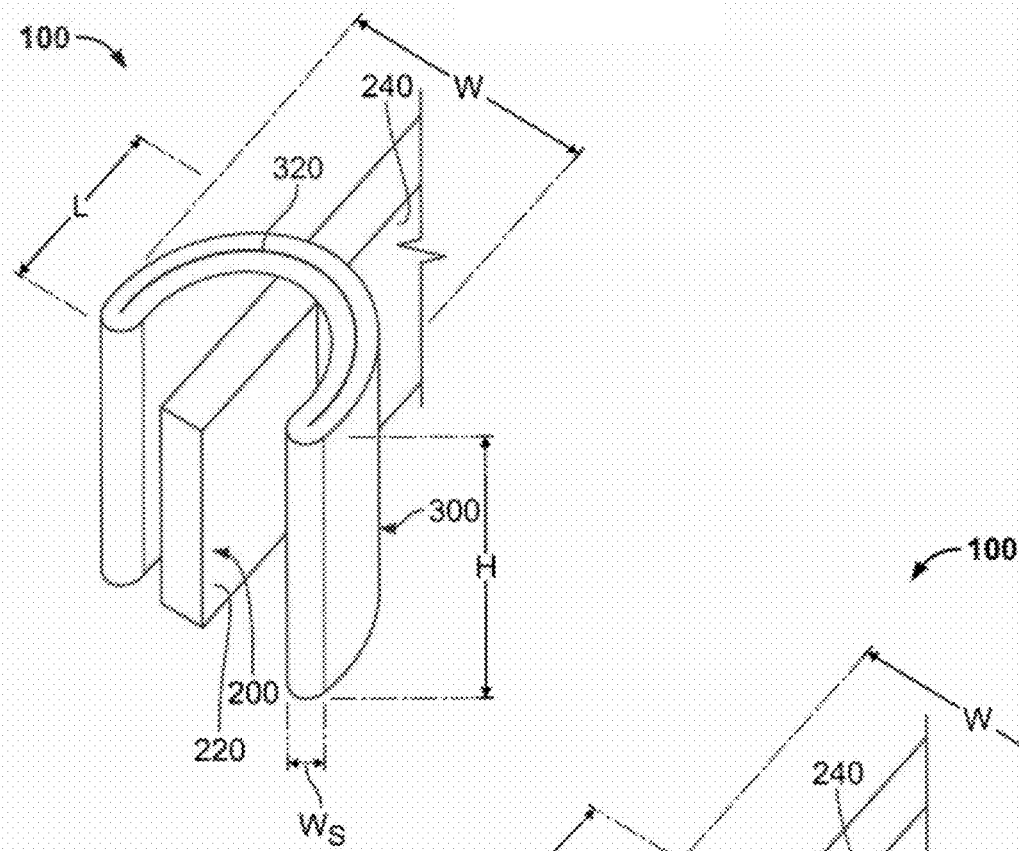
FIG. 3 is a perspective view of a beam of a MEMS device having an arcuate isolation joint.
Figure 4:
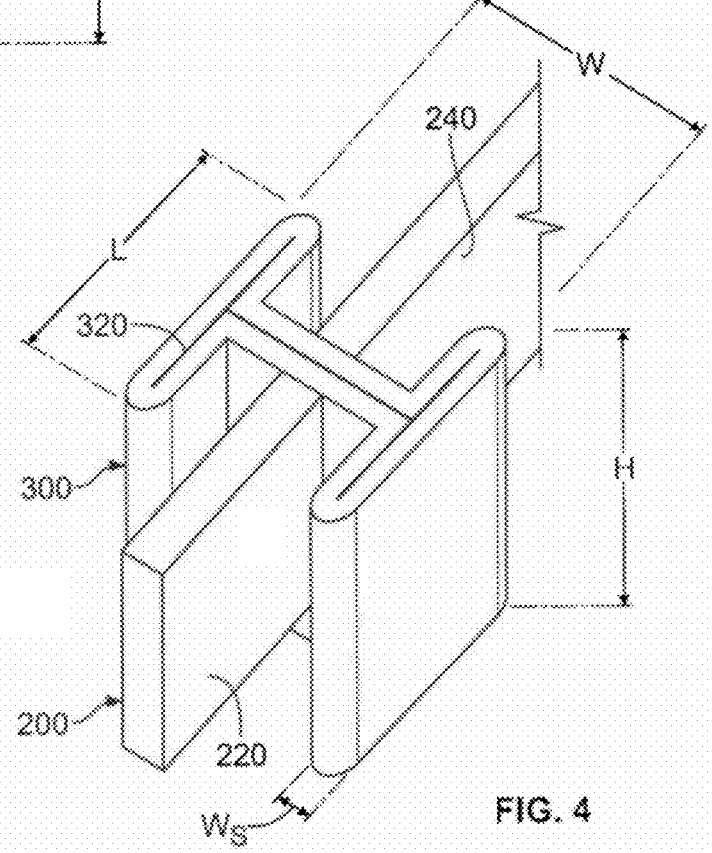
FIG. 4 is a perspective view of a beam of a MEMS device having an I-shaped isolation joint.
Figure 5:
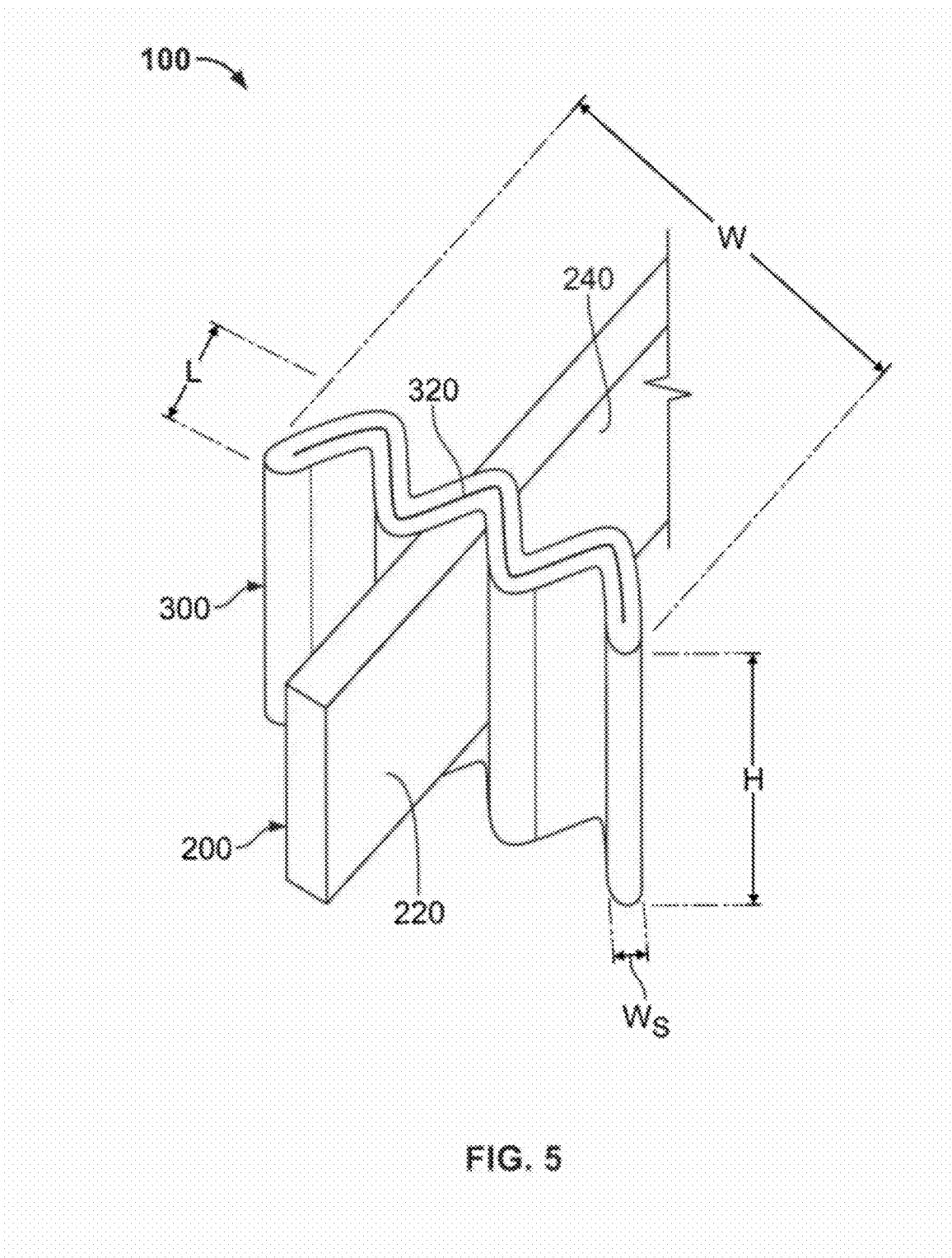
FIG. 5 is a perspective view of a beam of a MEMS device having an undulating isolation joint.

An isolation joint 300 is between the distal portion 220 and the proximal portion 240 of beam 200. The isolation joint 300 can electrically isolate the distal portion 220 from the proximal portion 240. The isolation joint 300 can have a seam 320 and an internal void (not shown). The isolation joint 300 has a non-linear shape when viewed from above. For example, the isolation joint can have an arc shape (as illustrated in FIG. 3), an I-shape (as illustrated in FIG. 4), an undulating shape (for example, a zigzag or saw tooth pattern as illustrated in FIG. 5), a curvilinear shape, and other non-linear shapes.

Figure 2:
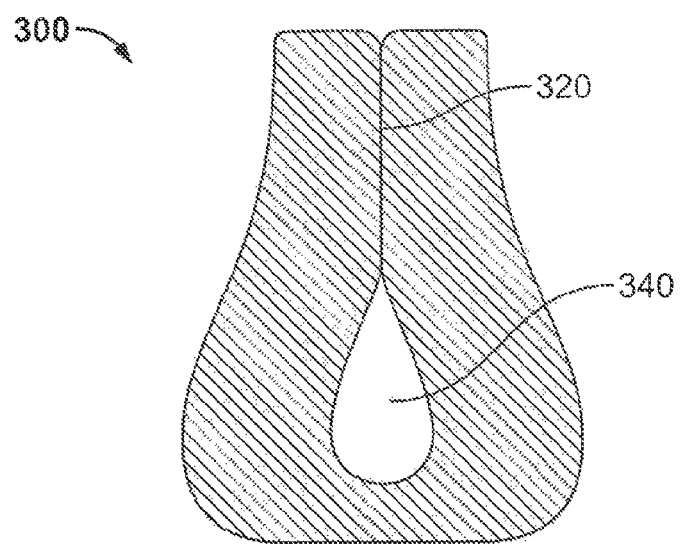
FIG. 2 is a cross-sectional view of the beam of FIG. 1 taken along line 2-2.

Advantageously, the non-linear shape increases the stiffness of the isolation joint 300, relative to a linear isolation joint as illustrated in FIG. 2. An increase in stiffness can prevent excess strain and, ultimately, fracture of the beam 200. Additionally, the non-linear shape can provide additional mechanical interlock between the sidewalls of the isolation joint 300.

The isolation joint can be made of one or more insulating dielectric material, for example, silicon dioxide or other suitable dielectric materials.

In another embodiment, the void (not shown) of the isolation joint 300 can also be filled with a filler material. The filler material can be, for example, doped or undoped polysilicon or any other suitable filler material. In one example, the isolation joint 300 comprises a thin layer of dielectric material that defines the void, and filler material that fills the void.

A beam 200 having a non-linear isolation joint 300 can have the following design parameters: width W, length L, height H, and segment width $W_s$. The segment width $W_s$ is typically about 1 μm to 2 μm. The segment width $W_s$ can be more are less than 1 μm to 2 μm. However, the minimum segment width $W_s$ is generally about 1 μm due to the limitations of standard lithography and etching techniques, and the maximum segment width $W_s$ is generally limited to minimize the required thermal oxidation, which minimizes manufacturing costs. The width W of isolation joint 300 is typically greater than the width of the beam that is being isolated.

Referring to FIG. 3, the radius of curvature of isolation joint 300 can dictate the length L. The smaller the radius of curvature the larger the length L of the isolation joint 300 becomes. The radius of curvature is preferably at least one half the width W of the arc-shaped isolation joint 300.

In an embodiment, a method of making a micro-electromechanical device having a non-linear isolation joint can include forming a non-linear isolation trench in a substrate, filling the isolation trench with a dielectric material, and forming a beam that is suspended relative to a surface of the substrate. The isolation trench filled with the dielectric material is between a first beam portion and a second beam portion.

Figure 6A:
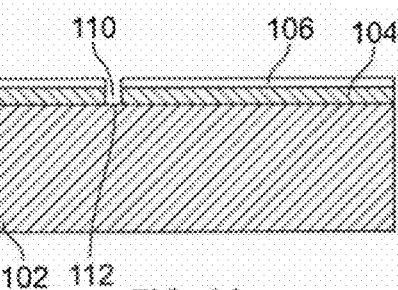
FIGS. 6A-6H illustrate an exemplary method of making a MEMS device having a non-linear isolation joint.
Figure 6E:
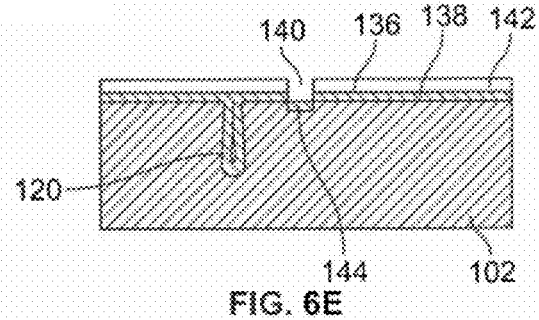
Figure 6B:
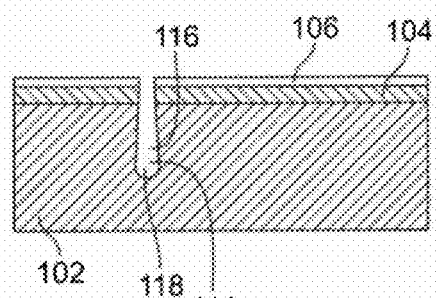
Figure 7:
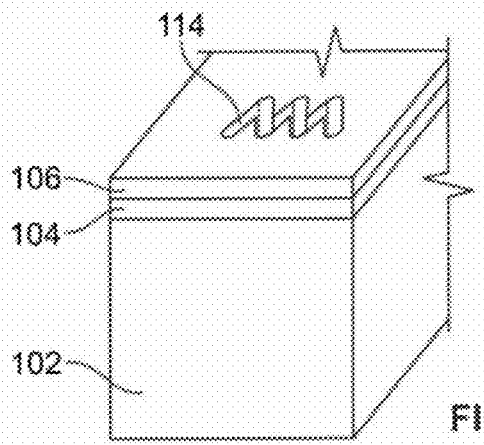
FIG. 7 is a perspective view of an undulating shaped isolation trench formed in a substrate.
Figure 8:
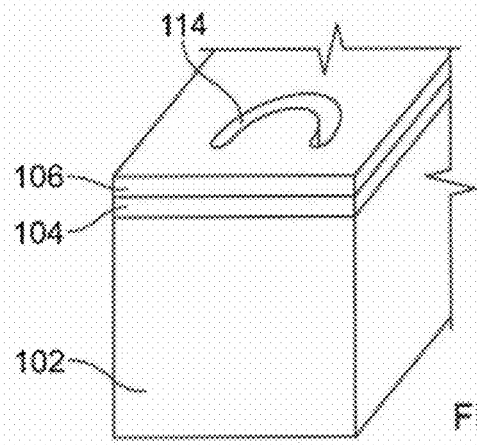
FIG. 8 is a perspective view of an arcuate isolation trench formed in a substrate.
Figure 9:
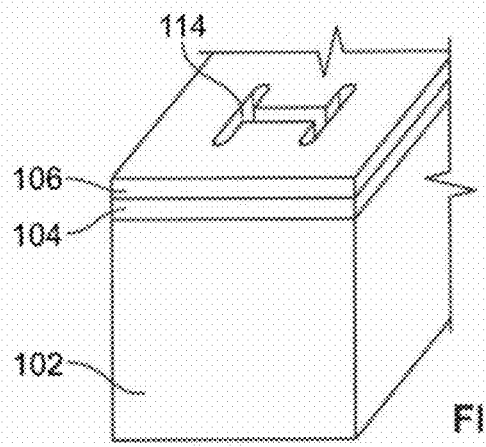
FIG. 9 is a perspective view of an I-shaped isolation trench formed in a substrate.

FIGS. 6A-6H illustrates an exemplary method of making a micro-electromechanical device according an embodiment. Particularly, FIGS. 6A-6B illustrate an exemplary method of forming an non-linear isolation trench in a substrate, for example, a silicon wafer. A (silicon) wafer 102 can be provided with a dielectric layer 104, preferably silicon dioxide (oxide). An oxide layer 104 is a masking layer that protects the silicon surface of the wafer 102 during a subsequent isolation trench etch. A resist 106 is then spun onto the wafer, and a non-linear isolation trench pattern 110 is defined using any suitable and standard photolithography techniques. Reactive ion etching is used to transfer the non-linear isolation resist pattern 110 to the mask layer 104 exposing the silicon surface 112. The non-linear isolation trench pattern 110 can have an arc shape (as illustrated in FIG. 8), an I-shape (as illustrated in FIG. 9), an undulating shape (as illustrated in FIG. 7), a curvilinear shape, or any other suitable non-linear shape. Any suitable form of lithography can be used to define the non-linear isolation trench pattern 110, for example, photolithography, electron-beam lithography, imprint lithography, and any other suitable forms of lithography.

Next, an non-linear isolation trench 114 can be formed in the wafer 102 by using any suitable form of etching, for example, by using a cyclic etch and deposition sequence that is repeated until the desired depth has been reach, deep reactive ion etching using a high etch rate and high selectivity, or any other suitable form of etching. The etch can be controlled so that the trench's side profile is reentrant, or tapered, with the top 116 of the trench being narrower than the bottom 118 of the trench. The reentrant profile ensures that good electrical isolation is achieved in subsequent processing by preventing silicon stringers. Although the illustrated side profile of the isolation trench is reentrant, the side profile of the non-linear isolation trench 114 can be any suitable shape. After the non-linear isolation trench 114 is etched, the resist layer 106 and the mask layer 104 are removed, typically, by using an oxygen plasma or a wet chemistry.

After forming a non-linear trench 114 in a substrate 102, the trench can be filled with an insulating dielectric material, for example, silicon dioxide or other suitable insulating dielectric materials. FIG. 6C illustrates an exemplary method of filling the non-linear isolation trench 114 that can produce an isolation joint 120 in the non-linear trench 114, and that can deposit a layer 122 of dielectric material on the top surface 112 of the silicon wafer 102 and dielectric layers on the sidewall 124 and bottom 126 of the trench. The silicon wafer 102 can be oxidized at high temperatures. This oxidation process consumes the silicon surfaces of the substrate to form silicon dioxide. The resulting volumetric expansion from this process causes the sidewalls 124 of the non-linear isolation trench 114 to encroach upon each other, eventually closing the trench opening at 116. During a trench fill, it is common for the non-linear isolation trench 114 to be incompletely filled, causing a seam 128 and a void 130 to be foamed in the non-linear isolation trench 114. Although a void 130 is illustrated in FIG. 6C, it is contemplated that no void can be formed between the sidewalls 124—the seam 128 runs along substantially the entire height of the non-linear isolation trench 114.

In one embodiment, there is no gap in the dielectric material on the side walls 124 at throat 116. Accordingly, the thickness of each dielectric sidewall 124 must be thicker than half the width of throat 116 to ensure that there is no gap.

Although thermal oxidation is described above for filling the trench with a dielectric material, other suitable techniques can be used such as chemical vapor deposition (CVD) techniques.

FIGS. 6D-6G illustrate exemplary surface conditioning steps and metal patterning steps that can be performed before forming a beam that is suspended relative to a surface of the substrate. Particularly, in FIG. 6D, to remove an indentation 132 at the seam 128, the surface can be planarized to form a flat surface 136 for subsequent lithographic and deposition steps. In FIG. 6E, a second lithography step opens vias to prepare contacts to the underlying silicon 102. This second lithographic step is performed by exposing and developing a pattern of via openings 140 in a layer of resist 142 on surface 136 and transferring the pattern into the underlying dielectric layer 138. After lithography, silicon is implanted in the region 144 to create an ohmic contact between the silicon and a metal layer on the surface of dielectric layer 138. After the silicon is implanted in region 144, the resist 142 is removed.

Figure 6F:
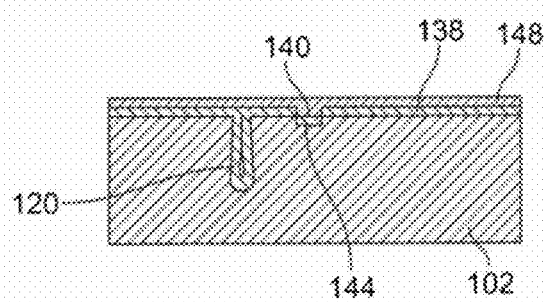
Figure 6C:
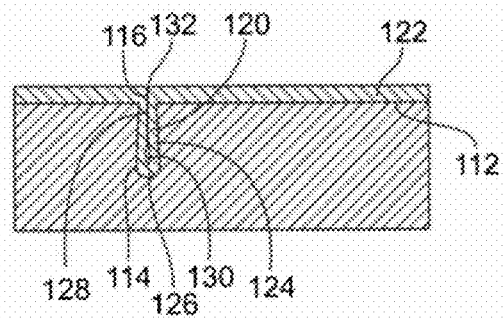
Figure 6G:
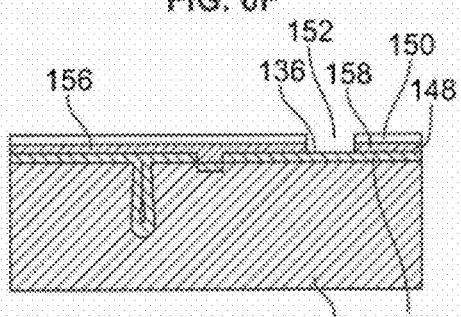
Figure 6D:
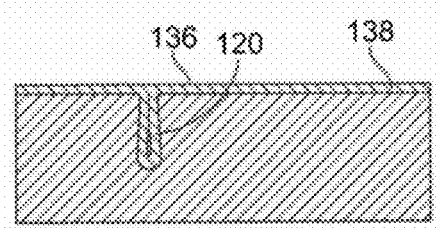

A metal layer 148, for example, aluminum, is deposited in FIG. 6F. The metal covers the surface 136 of the dielectric 138, and uniformly coats over the isolation joint 120. The metal layer 148 fills the via 140 and contacts the implanted region of silicon at region 144, electrically connecting the metal to the silicon to form an ohmic contact. Otherwise, the metal layer 148 is insulated from the substrate silicon 102 by means of the dielectric layer 138. A third photolithography step (coarse metal patterning) is shown in FIG. 6G. A resist layer 150 is spun on the top surface of the metal layer 148. The resist is patterned to provide open areas 152 where metal is not desired. The opening 152 in the resist is transferred to the metal layer 148 by wet chemical etching or reactive ion etching. The etch is stopped at the surface 136 of the oxide layer 138. The removal of metal at the opening 152 separates the region of metal 156 from the region of metal 158 on the top of an individual beam element. This is important in situations where multiple interconnection paths are required to and on the micromechanical structure. In other embodiments, any of the steps described above in FIGS. 6D-6G can be omitted or varied. For example, although coarse metal patterning is described above, the metal layer 148 can be patterned and etched to define a metal trace having a width that is smaller than the width of a beam to be subsequently formed.

Figure 6H:
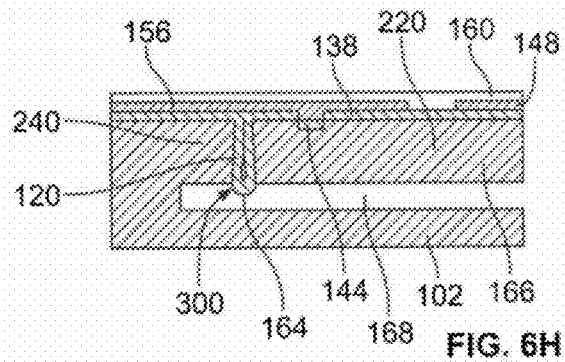

Finally, a beam that is suspended relative to a surface of the substrate can be formed. FIG. 6H illustrates an exemplary method of forming a beam that is suspended relative to a surface of the substrate. As illustrated in FIG. 6H, a final, fourth lithographic step can applied using resist layer 160, which is patterned to define an array of beam structures connected to create the entire microstructure. The resist pattern can be transferred through the metal layer 148 (if coarse metal patterning is used), for example, using reactive ion etching, and then through the dielectric layer 138 using, for example, reactive ion etching. The layers of resist, metal (if coarse metal patterning is used), and dielectric then serve as an etch mask for another deep silicon trench etch, which surrounds a beam structure to be formed with an isolation joint 120. To create (or release) a beam 166 suspended above a surface of the substrate, a passivation dielectric layer is deposited on the wafer and in the deep structure trenches. The dielectric layer is removed from the trench floor, and an isotropic silicon etch is performed to undercut the beam structure and leave a cavity 168 extending under the silicon beam 166, between the beam and the substrate 102. Electrical connection is made from the metal region, or interconnect 156, to the distal portion of silicon beam 166 by means of the contact region 144, allowing the silicon beam to be connected to suitable electrical circuitry for use as a capacitor in actuating and sensing applications.

In another embodiment, the non-linear isolation trench 114 is partially filled with a dielectric material such that a void exists between dielectric sidewalls 124 of the non-linear isolation trench 114. The void between the dielectric sidewalls 124 can be filled with a filler material, for example, doped or undoped polysilicon or any other suitable material. For example, a thin dielectric layer can formed in the non-linear isolation trench 114, leaving a void or trench between the dielectric layers on the sidewalls. Then a filler material, such as polysilicon, can be formed in the void between the dielectric sidewalls to fill the remainder of the isolation trench 114.

Although FIGS. 3-9 illustrate a single released beam incorporating a non-linear isolation joint, it understood that a MEMS device may be made of any number of such beams connected to each other or to the substrate in a manner to provide full device functionality.

MEMS Devices Having an Isolation Joint with a Bridge Portion

In another embodiment, a micro-electromechanical device can include a substrate, a beam, and an isolation joint that electrically isolates a portion of the beam from the substrate. The isolation joint can have a first portion and second portion, each having a seam and a void, and a solid bridge portion between the first portion and the second portion. The beam can be suspended above surface of the substrate. The solid bridge portion can improve the mechanical properties of the beam by increasing the beam's stiffness. Improving the beam's stiffness helps prevent the beam from fracturing.

Referring collectively to FIGS. 10-13, which illustrate exemplary embodiments of MEMS devices 100 having an isolation joint 300 with a bridge portion 390, the beam 200 can be suspended above a surface of a substrate (not shown). The beam 200 can have a distal portion 220 and proximal portion 240. The proximal portion 240 can be mechanically connected to the substrate so as to support the beam 200, for example, in a cantilever fashion. The beam 200 and the substrate can be made of, for example, silicon or other suitable materials.

An isolation joint 300 is between the distal portion 220 and the proximal portion 240 of beam 200. The isolation joint 300 can electrically isolate the distal portion 220 from the proximal portion 240 of the beam 200 and from the substrate. The isolation joint 300 can have a first portion 360 and a second portion 380. The first portion 360 and second portion 380 can each have a seam 320 and an internal void 340 (see FIG. 11 which illustrates a cross-sectional view of the MEMS device 100 in FIG. 10 taken along the line 11-11). The isolation joint 300 can also have a bridge portion 390. The bridge portion 390 is substantially solid—bridge portion 390 does not have an internal void or a seam like the first and second portions 360 and 380. The isolation joint 300 can be made of a dielectric material, for example, silicon dioxide. The isolation joint 300 can have more than two isolation joint portions, for example, when a wider beam 200 is needed.

In one embodiment, the bridge portion 390 is adjacent to the distal portion 220 and the proximal portion 240 of the beam 200. Advantageously, when beam 200 deflects, the resulting strain runs from proximal portion 240, through the solid bridge portion 390, to the distal portion 220. Because the strain runs through bridge portion 390, instead of the first portion 360 or second portion 380 which have voids 340, the beam 200 is stiffer and can better avoid fractures.

Figure 10:
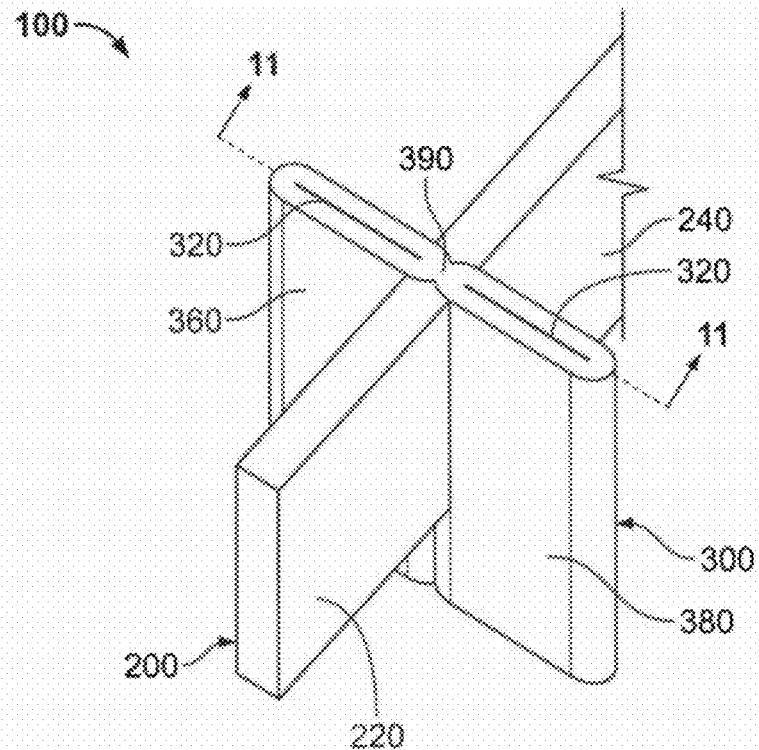
FIG. 10 is a perspective view of a beam of a MEMS device having an isolation joint with a bridge portion.
Figure 12:
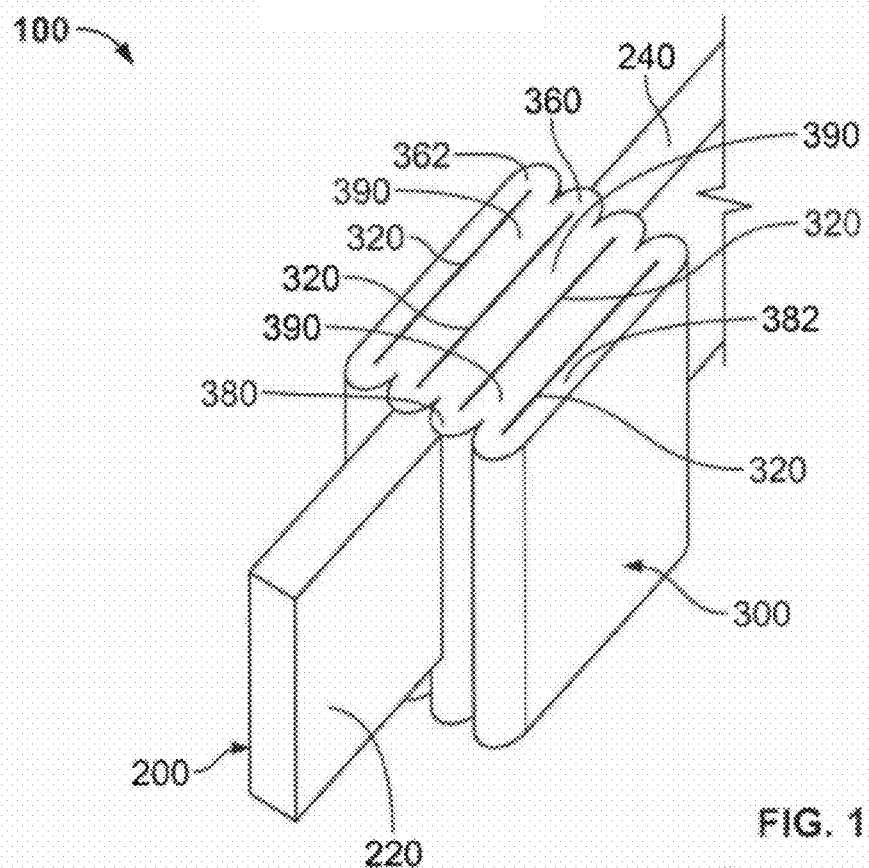
FIG. 12 is a perspective view of another beam of a MEMS device having an isolation joint with a bridge portion.

In an embodiment, the seams of the first portion 360 and the second portion 380 are perpendicular to the beam. For example, FIG. 10 illustrates an isolation joint 300 that has a first portion 360 and a second portion 380 that are linearly aligned with each other and perpendicular to the beam 200. Accordingly, the seams 320 of the first portion 360 and the second portion 380 are also perpendicular to beam 200. In another embodiment, the seams 320 of the first portion 360 and the second portion 320 are parallel to the beam 200. For example, FIG. 12 illustrates four seams 320 that are parallel to the direction at which the beam 200 extends. Additional isolation joint portions can be included when a wider beam is needed.

In one embodiment, the isolation joint can also include more than two portions having a seam 320, for example, three portions, four portions, five portions, and so on. For example, FIG. 12 illustrates an isolation joint 300 that has a first portion 360, a second portion 380, a third portion 362, and a fourth portion 382. A bridge portion 390 is between each portion, and each portion has a seam 320.

In an embodiment, the seams 320 can have a linear or straight shape, or a non-linear shape, for example, a T-shape, an I-shape, an arc shape, an undulating shape, a curvilinear shape, any other non-linear shape, or any combination thereof. In another embodiment, the seams 320 can be any combination of linear or non-linear shapes. For example, the seams 320 can include a linear seam between the flanges of two T-shape seams.

Figure 13:
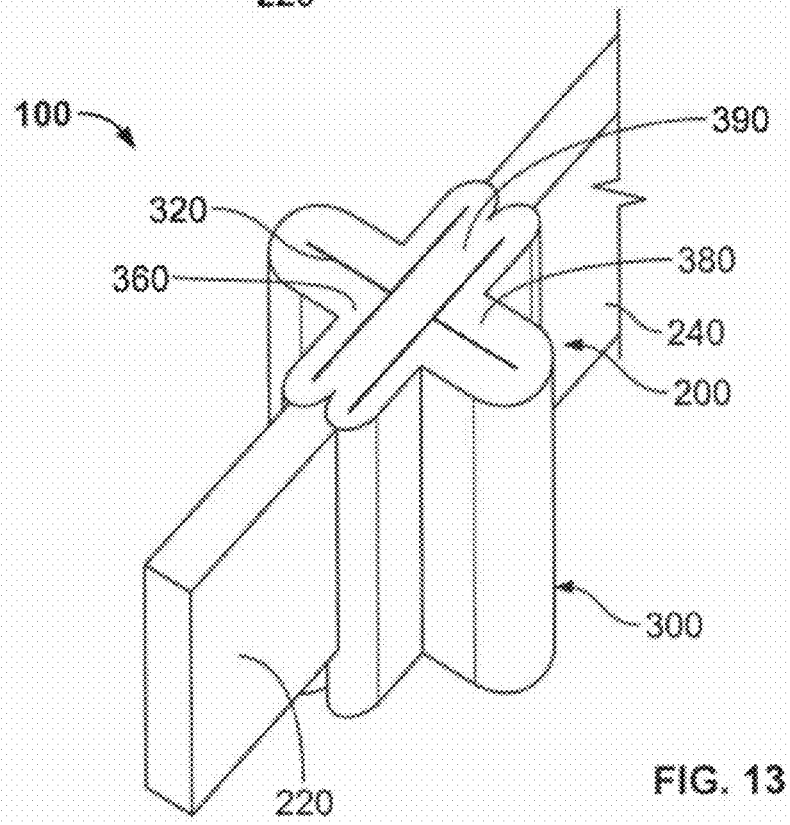
FIG. 13 is a perspective view of yet another beam of a MEMS device having an isolation joint with a bridge portion.

FIG. 13 illustrates an example of an isolation joint 300 having non-linear seams 320. Both the first portion 360 and the second portion 380 have seams 320 that are T-shaped, and the bridge portion 390 of the isolation joint 300 is between the two portions of the seams 320 that are parallel to the beam 200.

In another embodiment, the isolation joint 300 can also include a filler material in the voids of the first isolation portion 360 and the second isolation joint portion 380. The filler material can be, for example, doped or undoped polysilicon or any other suitable filler material. In one example, the isolation joint 300 comprises a thin layer of dielectric material that defines a void, and filler material that fills the void.

In an embodiment, a method of making a micro-electromechanical device having a bridge portion as described above can include forming a first isolation trench and a second isolation trench in a substrate, filling the first isolation trench and the second isolation trench with a dielectric material by thermal oxidation, and forming a beam that is suspended relative to a surface of the substrate. The portion of the substrate that was between the first isolation trench and the second isolation trench comprises an oxide after thermal oxidation.

Figure 14:
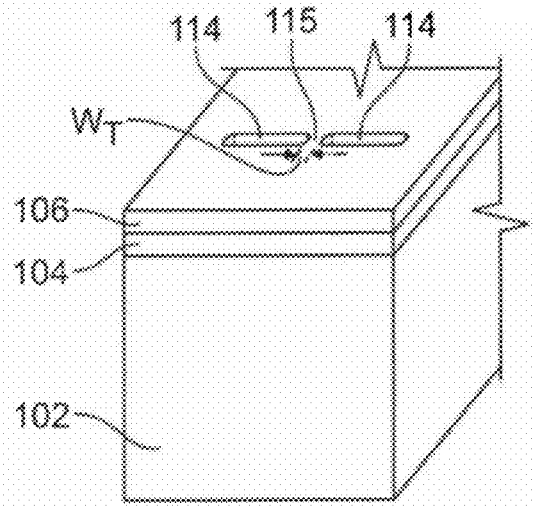
FIG. 14 is a perspective view of two linear isolation trenches formed in a substrate.
Figure 15:
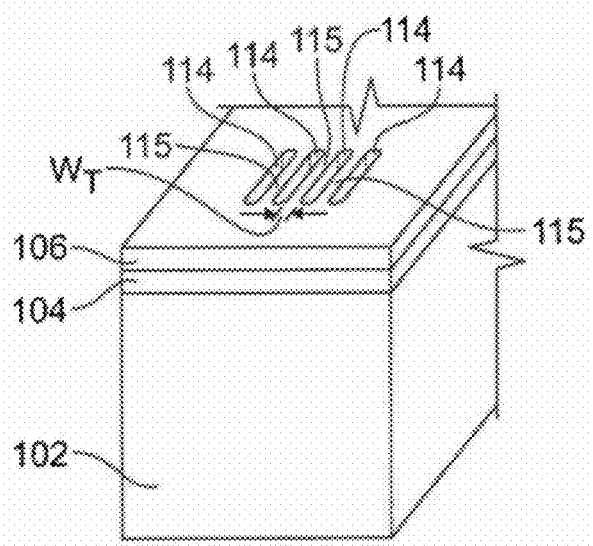
FIG. 15 is a perspective view of four linear isolation trenches formed in a substrate.
Figure 16:
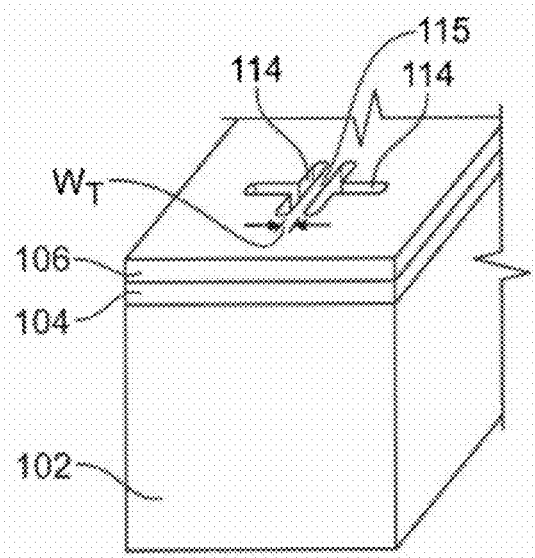
FIG. 16 is a perspective view of two T-shaped isolation trenches formed in a substrate.

In an embodiment, the steps of foaming the isolation trenches, filling the isolation trenches with a dielectric material by thermal oxidation, and forming a beam that is suspended relative to a surface of the substrate are substantially as described above referencing FIGS. 6A-6H with the exception that at least two isolation trenches 114 are formed in the substrate 102. For example, at least two trench patterns 110 are defined in a resist 106, for example, using any suitable lithography technique, the trench patterns 110 are transferred to the mask layer 104, and then isolation trenches 114 are formed in the substrate 102, for example, by etching. The trench patterns 110 can have any suitable shape when viewed from above, for example, a linear shape such as a straight line, or a non-linear shape such as an arc shape, an I-shape, an undulating shape, a curvilinear shape, or any other suitable non-linear shape. FIGS. 14-16 illustrate exemplary embodiments having at least two isolation trenches 114 formed in the substrate 102.

Figure 11:
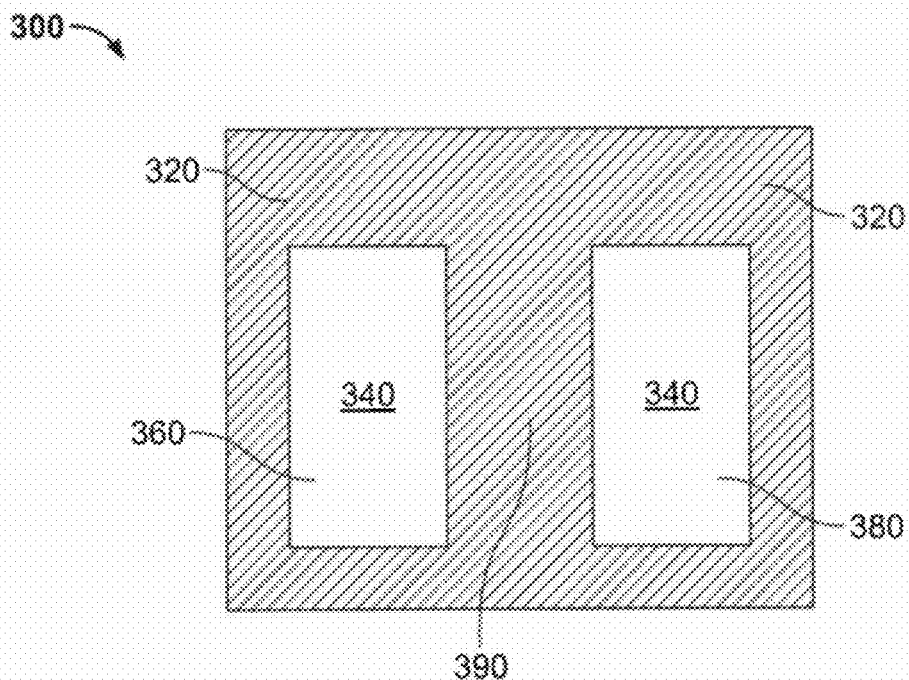
FIG. 11 is a cross-sectional view of the beam of FIG. 10 taken along line 11-11.

Accordingly, when the isolation trenches 114 are filled with a dielectric material by thermal oxidation, the portion 115 (FIGS. 14-16) of the substrate between each isolation trench 114 is converted to an oxide, for example, silicon dioxide when the substrate is silicon, to form a bridge portion 390 of the isolation joint 300. In an embodiment, the bridge portion 390 does not have a seam 320 or a void 340 because the entire portion 115 of the substrate between each isolation trench 114 is converted to an oxide as illustrated in FIG. 11, which shows a cross-sectional view of the isolation joint 300 in FIG. 10 along line 11-11. The width $W_T$ between each trench is determined so that the entire portion 115 is converted to an oxide while also creating a topology that allows for easy subsequent processing. If the width $W_T$ is large, the portion 115 will not convert entirely to an oxide, and the isolation joint 300 will not function as an electrical insulator because of the remaining conductive silicon. However, if the width $W_T$ is too small, the total amount of oxide will be limited, creating a topology that makes subsequent processing difficult and that weakens the MEMS device.

In one embodiment, the suspended beam is formed so that the bridge portion 390 of the isolation joint 300 is adjacent the distal portion 220 and the proximal portion 240 of the beam 200. For example, in the fourth lithographic step described above in FIG. 6H, the resist layer 160 can be patterned to define a beam that is aligned with the bridge portion 390 of the isolation joint, and the beam pattern can be transferred to the resist, metal, and dielectric layers. Thus, when the beam 200 is released from the substrate, for example, by an isotropic silicon etch, the bridge portion 390 is between the distal portion 220 of the beam 200 and the proximal portion 240 of the beam 200.

Figure 17A:
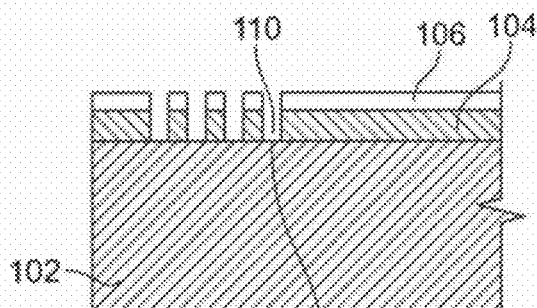
FIGS. 17A-17C illustrate a portion of an exemplary method of making a MEMS device having an isolation joint with a bridge portion.
Figure 17B:
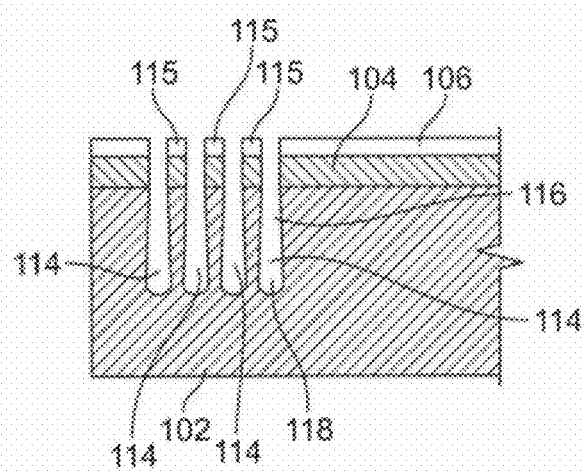
Figure 17C:
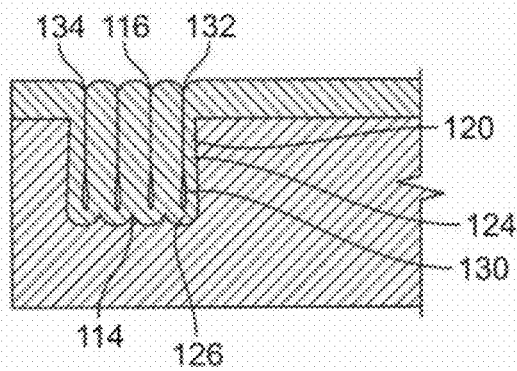

FIGS. 17A-17C illustrate an embodiment of forming isolation trenches and filling the isolation trenches with a dielectric material when making a MEMS device as illustrated in FIGS. 12 and 15. As illustrated in FIG. 17A, four trench patterns 110 are defined in a resist 106, for example, using any suitable lithography technique. The trench patterns 110 are transferred to the mask layer 104, and then isolation trenches 114 are formed in the substrate 102, for example, by etching. The trench patterns 110 can have a straight or linear shape when viewed from above and can have a reentrant side profile or other suitable side profiles. In an embodiment, the portion 115 between each isolation trench 114 extends to the bottom 118 of each trench 114—the bottom 118 of each trench is separated by the portion 115 between each trench 114. This separation can be achieved by either increasing the width $W_T$ between the isolation trenches 114 or by adjusting the etch so that the width of the bottom 118 of the isolation trench 114 is reduced. Next, as illustrated in FIG. 17C, the isolation trenches 114 are filled with a dielectric material by thermal oxidation. The portions 115 of the substrate 102 between each isolation trench 114 is converted to silicon dioxide to form a bridge portion 390 of the isolation joint 300. Because every portion 115 extended to the bottom 118 of the isolation trenches 114, the bridge portion 390 extends the full height of the isolation joint 300, which increases the overall strength of isolation joint 300.

In one embodiment, the isolation trenches 114 can be perpendicular to the direction of a formed beam, for example, the device 100 illustrated in FIG. 10. In another embodiment, the isolation trenches 114 can be parallel to the direction of a formed beam 200, for example, the device 100 illustrated in FIG. 12.

In an embodiment, the method of making isolation joints having bridge portions further comprises filling voids defined by the dielectric material with a filler material. The filler material can be, for example, doped or undoped polysilicon or any other suitable material. For example, a thin dielectric layer can formed in the isolation trenches 114, leaving a void or trench between the dielectric layers on the sidewalls of the trench. Then a filler material, such as polysilicon, can be formed in the void between the dielectric sidewalls to fill the remainder of the isolation trench 114.

Examples Software Implementations

In addition to hardware implementations of MEMS devices described above, such MEMS devices may also be embodied in software disposed, for example, in a computer usable (e.g., readable) medium configured to store the software (e.g., a computer readable program code). The program code causes the enablement of embodiments of the present invention, including the fabrication of MEMS devices disclosed herein.

For example, this can be accomplished through the use of general programming languages (such as C or C++), hardware description languages (HDL) including Verilog HDL, VHDL, Altera HDL (AHDL) and so on, or other available programming and/or schematic capture tools (such as circuit capture tools). The program code can be disposed in any known computer usable medium including semiconductor, magnetic disk, optical disk (such as CD-ROM, DVD-ROM) and as a computer data signal embodied in a computer usable (e.g., readable) transmission medium (such as a carrier wave or any other medium including digital, optical, or analog-based medium). As such, the code can be transmitted over communication networks including the Internet and intranets. It is understood that the functions accomplished and/or structure provided by the systems and techniques described above can be embodied in program code and may be transformed to hardware as part of the production of MEMS devices.

CONCLUSION

While various embodiments of the present invention have been described above, it should be understood that they have been presented by way of example only, and not limitation. It will be understood by those skilled in the relevant art(s) that various changes in form and details may be made therein without departing from the spirit and scope of the invention as defined in the appended claims. Accordingly, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

What is claimed is:

1. A micro-electromechanical device comprising:
a substrate;

a beam suspended relative to a surface of the substrate, the beam comprising a first beam portion and a second beam portion; and an isolation joint between the first beam portion and the second beam portion, the isolation joint having a first isolation joint portion, a second isolation joint portion, and a first solid bridge portion, the bridge portion is between the first isolation joint portion and the second isolation joint portion, the first isolation joint portion and the second isolation joint portion each have a seam.

2. The micro-electromechanical device according to claim 1, wherein the first isolation joint portion and the second isolation joint portion each further comprise a void.

3. The micro-electromechanical device according to claim 1, wherein the isolation joint further comprises an additional isolation joint portion having a seam, and an additional solid bridge portion.

4. The micro-electromechanical device according to claim 1, wherein the first bridge portion is adjacent to the first beam portion and the second beam portion.

5. The micro-electromechanical device according to claim 1, wherein the seam of the first isolation joint portion and the seam of the second isolation joint portion are perpendicular to the beam.

6. The micro-electromechanical device according to claim 1, wherein the seam of the first isolation joint portion and the seam of the second isolation joint portion are parallel to the beam.

7. The micro-electromechanical device according to claim 1, wherein the seam of the first isolation joint portion and the seam of the second isolation joint portion have a non-linear shape.

8. The micro-electromechanical device according to claim 7, wherein the non-linear shape is a T-shape.

9. The micro-electromechanical device according to claim 1, wherein each isolation joint portion comprises a dielectric material.

10. The micro-electromechanical device according to claim 9, wherein the dielectric material is silicon dioxide.

11. The micro-electromechanical device according to claim 9, wherein the isolation joint further comprises a filler material in the void of each isolation joint portion.

12. The micro-electromechanical device according to claim 11, wherein the filler material comprises doped or undoped polysilicon.

13. The micro-electromechanical device according to claim 1, wherein the first isolation joint portion and the second isolation joint portion each comprise at least two seams.

14. A computer-program product comprising a non-transitory computer-readable storage medium containing instructions that, if executed on a computing device, define a micro-electromechanical device comprising:

a substrate;

a beam suspended relative to a surface of the substrate, the beam comprising a first beam portion and a second beam portion; and an isolation joint between the first beam portion and the, second beam portion, the isolation joint comprising a first isolation joint portion, a second isolation joint portion, and a solid bridge portion, the bridge portion is between the first isolation joint portion and the second isolation joint portion, the first isolation joint portion and the second isolation joint portion each having a seam.

* * * * *